United States Patent [19]
McMinn et al.

[11] Patent Number: 5,646,893
[45] Date of Patent: Jul. 8, 1997

[54] SEGMENTED READ LINE CIRCUIT PARTICULARLY USEFUL FOR MULTI-PORT STORAGE ARRAYS

[75] Inventors: Brian D. McMinn, Buda; R. Tod Calvin, Austin, both of Tex.

[73] Assignee: Advanced Micro Devices, Inc., Sunnyvale, Calif.

[21] Appl. No.: 525,431

[22] Filed: Sep. 7, 1995

[51] Int. Cl.$^6$ ........................................ G11C 7/00
[52] U.S. Cl. ........................ 365/189.05; 365/230.05; 365/63
[58] Field of Search ................ 365/51, 63, 189.05, 365/230.05, 189.01

[56] References Cited

U.S. PATENT DOCUMENTS

| | | | |
|---|---|---|---|
| 4,532,613 | 7/1985 | Takemae et al. | 365/189.05 |
| 5,422,857 | 6/1995 | Ninomiya et al. | 365/230.05 |

FOREIGN PATENT DOCUMENTS

| | | |
|---|---|---|
| 0 169 460 A3 | 1/1986 | European Pat. Off. . |
| 0 520 788 A3 | 12/1992 | European Pat. Off. . |

OTHER PUBLICATIONS

Toshihiko Hirose, et al., "A 20–ns 4–Mb CMOS SRAM with Hierarchical Word Decoding Architecture", pp. 1068–1074, IEEE Journal of Solid–State Circuits, vol. 25, No. 5, Oct. 1990.

*Primary Examiner*—Joseph A. Popek
*Attorney, Agent, or Firm*—Skjerven, Morrill, MacPherson, Franklin & Friel; Andrew C. Graham

[57] ABSTRACT

A read line for a column of memory cells within an array is divided into a first read line segment, a first read buffer, and a second read line segment. Both the first and second read line segments occupy a single wiring channel. When reading a memory cell connected to the first read line segment, the level of the first read line segment is sensed by the first read buffer and conveyed to a column read output node by way of the second read line segment and an associated second read buffer. Alternatively, when reading a memory cell connected to the second read line segment, the first read buffer is disabled, thus adopting a high impedance output, and the level of the second read line segment is sensed by the second read buffer and conveyed to the column read output node. Each of the first and second read line segments have less capacitive loading than a single read line, which results in lower power and faster read access times. Further, when reading a memory cell coupled to the second read line segment, the first read line segment remains in a precharged state, conserving power even more. Consequently, when used as part of a multiport register file within a processor, power is reduced by implementing registers having a high frequency of reference as memory cells coupled to the second read line segment.

20 Claims, 7 Drawing Sheets

SEGMENTED READ LINE CIRCUIT PARTICULARLY USEFUL FOR MULTI-PORT STORAGE ARRAYS

BACKGROUND OF THE INVENTION

1. Field of the Invention

This invention relates to the design of integrated circuit memory arrays, and more specifically relates to reading data stored within a memory array.

2. Description of Related Art

An array configuration is a highly useful and frequently encountered structure for storing data within an integrated circuit. In many common arrangements, a two-dimensional array of storage elements (also known as memory cells) is arranged into rows and columns, with each memory cell connected to an associated row and column. A group of memory cells is selected by activating a row line (also known as a wordline) to which all the cells of the group are connected. This enables each of the memory cells within the group, when in a read mode, to drive its associated column line (also known as a bitline) in a manner corresponding to the data stored within each memory cell. Alternatively, when in the write mode, each memory cell is enabled to receive data conveyed on the bitline to the memory cell.

There are many ways to arrange a bitline configuration and an associated read circuit. One well known technique uses a cross-coupled sense amplifier, or "sense amp". Typically a pair of bitlines couple each of the two sides of a cross-coupled memory cell to a differential amplifier which resolves a slight difference in voltage between the two bitlines into a stable, full-level value (which may then be further decoded and eventually routed to an output signal). Sense amp circuits are constructed from a bi-stable circuit block (such as a cross-coupled differential pair of transistors) which is forced into an unstable state just before the bitlines are to be sensed. During sensing, a slight differential input from the bitlines pushes the sense amp into one of two stable states (corresponding to reading a logic "1" or a logic "0"). Consequently, sense amp circuits consume significant power while actually sensing the bitlines.

Alternatively, a separate line, known as a "write line", may be employed for writing a selected memory cell within a column of memory cells, and a separate line, known as a "read line", may be used for reading a selected memory cell within the column of memory cells. Such write and read lines may be configured as differential lines (and which therefore each employ two wires). To save area another well known technique uses a single read line to sense data within a memory cell, and is frequently known as a "single-ended" read (as opposed to a differential read as in the differential sense amp discussed above). While several variations are possible, one frequently encountered configuration precharges each read line high. When a memory cell is enabled by a read select line, the read line is either discharged by the memory cell (such as for a logic "0") or the read line is left in the precharged state (such as for a logic "1").

Such a single-ended read structure typically requires a greater voltage transition on the read line for proper sensing to occur than for a differential sense amp configuration. However, the single-ended read line configuration is more efficient for multi-port RAMs because each read port requires a separate read line for each column of memory cells within the array. The finite number of available metal lines through a memory array either limits the number of read ports which may be implemented, or requires usage of a larger memory cell layout just to support the additional read lines necessary for each read port. Since a single-ended read configuration requires only one metal line per read line for each column of memory cells in the array, such a configuration allows twice as many read ports as would a differential sense amp configuration, which requires two metal lines for each "read line" equivalent.

FIG. 1 illustrates the interconnections necessary for a multi-port memory cell 10 having two write ports and four read ports (a "2W-4R" memory cell). The read ports are single-ended read ports as described above, and consequently have one metal wire for each read line. A read select line for a given port directs the memory cell 10 to drive a corresponding read line for each port. Thus, read select lines RDSEL1, RDSEL2, RDSEL3, and RDSEL4 and read lines RDBIT1, RDBIT2, RDBIT3, and RDBIT4 allow for independent reading of the logic level stored within the memory cell 10 by each of the four read ports. Also shown in FIG. 1 are two write select lines, WRSEL1 and WRSEL2, for enabling the memory cell 10 to respond to data conveyed to the cell on either of two write data lines WRBIT1 and WRBIT2, respectively. For convenience, the group of four read lines RDBIT1–RDBIT4 may also be referred to as a read bus RDBITx. Similarly, the group of four read select lines RDSEL1–RDSEL4 may be referred to as read select bus RDSELx, the group of two write select lines WRSEL1–WRSEL2 may be referred to as write select bus WRSELx, and the group of two write data lines WRBIT1–WRBIT2 may be referred to as write data bus WRBITx.

Referring now to FIG. 2, an array 20 illustrates a traditional array configuration using a group of memory cells such as that shown in FIG. 1. For simplicity of discussion a 3×3 array is shown, but one skilled in the art will immediately recognize the extendibility of such an array. A decoder 22 generates each of the four signals within read select bus RDSELx1, which bus is connected to each of memory cells MC11, MC12, and MC13 within the first row of memory cells of array 20. Similarly, the decoder 22 generates each of the two signals within write select bus WRSELx1, which bus is also connected to each of the same three memory cells MC11, MC12, and MC13. Read select busses RDSELx2 and RDSELx3 service the second row (MC21, MC22, and MC23) and third row (MC31, MC32, and MC33) of memory cells, respectively, as do write select busses WRSELx2 and WRSELx3, respectively.

In the column direction, write data bus WRBITx1 is connected to each of the memory cells MC11, MC21, and MC31 within the first column of the array 20. Likewise, write data busses WRBITx2 and WRBITx3 are connected to the second column (MC12, MC22, and MC32) and third column (MC13, MC23, and MC33) of memory cells, respectively. Similarly, read line busses RDBITx1, RDBITx2, and RDBITx3 are connected to the first column, the second column, and the third column of memory cells, respectively. The write data busses and the read line busses are typically, although not always, connected to an I/O block which includes various buffers and decoders, which for clarity is not shown in FIG. 2.

As can be seen in the array 20 of FIG. 2, each memory cell is connected to a read line for each of four read ports. Within a given column of the array 20, a given read line is connected to every memory cell within the column. Since the speed of the read line is constrained by the capacitive loading upon the read line, a longer read line is more difficult to sense quickly. One constraint on the speed of a read line is the capacitive loading placed upon a read line by each memory cell. This capacitive loading arises from the read line traversing above other conductive structures within the memory cell, as well as from junction capacitance and gate overlap capacitance within each of the memory cells. This capacitive loading increases as additional memory cells are connected to each read line, which tends to slow the discharge of the read line when reading a logic "0". Since a great proportion of the capacitive loading placed upon a read line by a memory cell arises from the junction capacitance of the drain diffusion of a transistor within the memory cell used to discharge the read line, using a larger discharge transistor increases the available current but also increases the total capacitive load on the read line, and thus does not afford much increase in speed.

SUMMARY OF THE INVENTION

It is an object of the present invention to provide a high performance read line structure which utilizes a single wiring channel for an entire array.

It is a further object of the present invention to provide a read line structure which affords low power operation of a memory array.

These and other objects are accomplished by the current invention in which, for one embodiment, a group of read line segments are used for a column of the memory array, and which segments are serially connected across the array by a group of read buffers. Each of these read line segments may reside within the same wiring channel, because no two read line segments run side-by-side. Each read buffer is individually enabled to sense the voltage of the read line segment coupled to its input, and to drive the adjacent read line segment coupled to its output. Because each read line segment is connected to a group of memory cells which is smaller than the total number of memory cells within a given column of the memory array, faster access times are achievable than with single read line structures. Furthermore, lower power dissipation results because for many of the memory cells, only a portion of the read line segments are active. The remainder of the read line segments stay inactive, typically in a precharged state.

In one embodiment the present invention includes an apparatus for reading a selected memory cell from a column of memory cells within a memory array of an integrated circuit, and for conveying information read therefrom to a column read output node. A first read fine segment has coupled thereto a first plurality of memory cells, and a second read line segment has coupled thereto a second plurality of memory cells. A first read buffer has an input coupled to the first read line segment and has an output coupled to the second read fine segment, said read buffer having an enable input which, when active, enables the output and which, when inactive, disables the output by causing the output to adopt a high impedance state. A second read buffer has an input coupled to the second read line segment and has an output coupled to the column read output node.

In another embodiment, the present invention includes a first read line segment having coupled thereto a first plurality of memory cells, and a second read line segment having coupled thereto a second plurality of memory cells. A first read buffer has an input coupled to the first read line segment and has an output coupled to the second read line segment, said first read buffer for sensing a voltage level of the first read line segment when the selected memory cell is among the first plurality of memory cells, and for subsequently driving a voltage onto the second read line segment corresponding to the voltage level sensed on the first read line segment, and alternatively said first read buffer for adopting a high impedance state on the output thereof when the selected memory cell is among the second plurality of memory cells coupled to the second read line segment. Also included is a second read buffer having an input coupled to the second read line segment and having an output coupled to a column read output node, said second read buffer for sensing a voltage level of the second read line segment when the selected memory cell is among the second plurality of memory cells, and for subsequently driving a voltage onto the column read output node corresponding to the voltage level sensed on the second read line segment, and alternatively when the selected memory cell is among the first plurality of memory cells coupled to the first read line segment, said second read buffer for sensing a voltage level of the second read line segment as driven by the first read buffer, and for subsequently driving a voltage onto the column read output node corresponding to the voltage level sensed upon the second read line segment.

In yet another embodiment of the present invention, an apparatus for reading a selected memory cell from a column of memory cells within a memory array of an integrated circuit includes a plurality "M" of read line segments arranged sequentially and in a non-overlapping manner, wherein "i"=1, 2, . . . "M", each read line segment "i" of the plurality "M" of read line segments having coupled thereto an associated plurality of memory cells. The apparatus also includes a plurality "M−1" of read buffers, wherein "j"=1, 2, . . . "M−1", each read buffer "j" of the plurality "M−1" of read buffers having an input coupled to a respective read line segment "j" for sensing a voltage level thereon, and each read buffer "j" further having an output coupled to an adjacent read line segment "j+1" for driving, when enabled, a voltage thereon corresponding to the voltage level sensed on its respective input. Further included is a read buffer "M" having an input coupled to a respective read line segment "M" for sensing a voltage level thereon, and having an output coupled to a column read output node for driving a voltage thereon corresponding to the voltage level sensed on its respective input. A logic state stored within a selected memory cell associated with a read line segment "k" of the column of memory cells, wherein "k"=1, 2, . . . "M", is sensed and conveyed to the column read output node by enabling the read buffers "k" through "M" disposed between the read line segment "k" and the column read output node, if any such read buffer is not already enabled.

In a method embodiment of the current invention for use within a memory array of an integrated circuit, a method for reading a selected memory cell from a column of memory cells and conveying information read therefrom to a column read output node includes providing a plurality of read line segments for the column of memory cells, wherein a respective portion of the memory cells within the column are coupled to each respective one of the plurality of read line segments. The method then includes enabling the selected memory cell to drive a signal onto the respective read line segment coupled thereto, said signal corresponding to a logic value stored previously into the selected memory cell, followed by sensing the signal developed on the read line segment associated with the selected memory cell. The method further includes driving a corresponding signal to the previously-sensed signal onto an adjacent read line segment, said adjacent read line segment disposed between the selected read line segment and the column read output node, and buffering the corresponding signal on the adjacent read line segment to the column read output node by way of any intervening read line segments disposed therebetween.

DETAILED DESCRIPTION OF THE PREFERRED EMBODIMENTS

Certain structures may be employed to reduce the limitation of large RAM arrays. The circuit structure shown in FIG. 3 includes a read line tree structure for a single port of a memory array (either for a single-port RAM or for a single port of a multi-port RAM). A first group of memory cells (not shown) is connected to a local read line 30. When an addressed memory cell connected to local read line 30 is enabled for read, a buffer 34 is enabled to sense the local read line 30 and to then drive a global read line 38, which is sensed by buffer 39. Similarly, a second, third, and fourth group of memory cells (not shown) are connected to local read lines 31, 32, and 33, respectively, which are respectively sensed by buffers 35, 36, and 37 which are each connected to global read line 38. Each buffer is enabled only when a memory cell connected to an associated local read line is enabled for reading, and consequently only one buffer is enabled at any single time. Each memory cell only needs to discharge an associated local read line, while a buffer senses the local read line and discharges the much-larger global read line.

Figure 4:
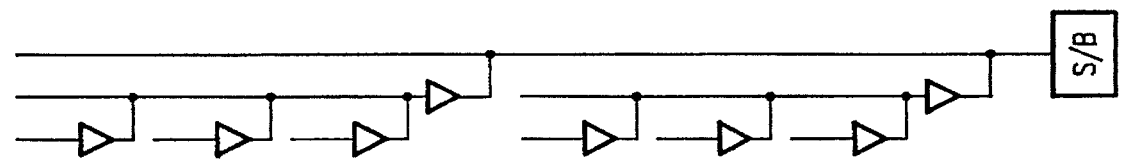
FIG. 4 is a block diagram of another physical embodiment of a read line tree structure for a single port of a memory array.
Figure 3:
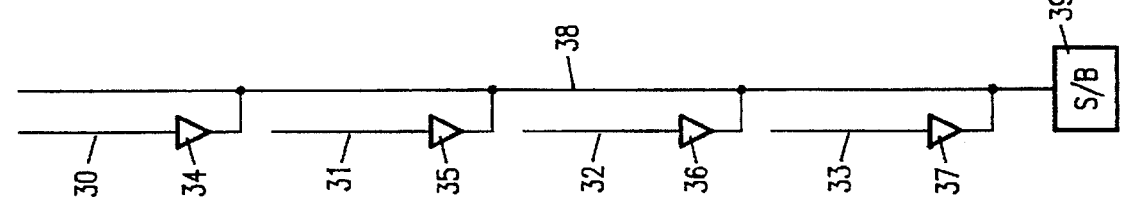
FIG. 3 is a block diagram of one physical embodiment of a read line tree structure for a single port of a memory array.

Such an arrangement may be expanded from the two-level tree shown in FIG. 3 to higher level tree structures. For example, FIG. 4 shows an analogous read line structure (for a single port) implemented in a three-level tree. While offering a significant improvement in local capacitive loading, a disadvantage of these tree approaches relates to the layout of the array—each level of such a tree requires a separate wiring channel through the entire array.

Figure 1:
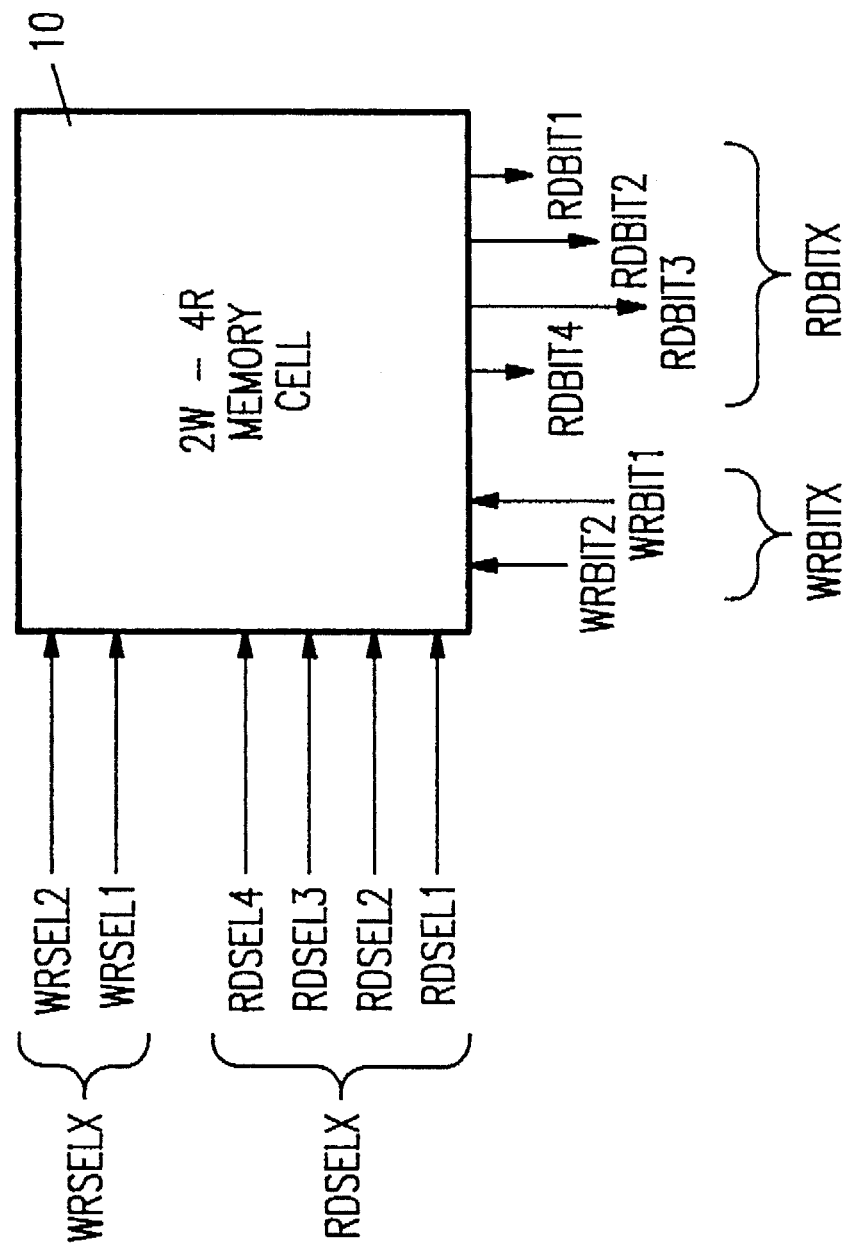
FIG. 1, labelled prior art, is an interface diagram of a multi-port memory cell, illustrating the signal connections to and from such a memory cell.
Figure 2:
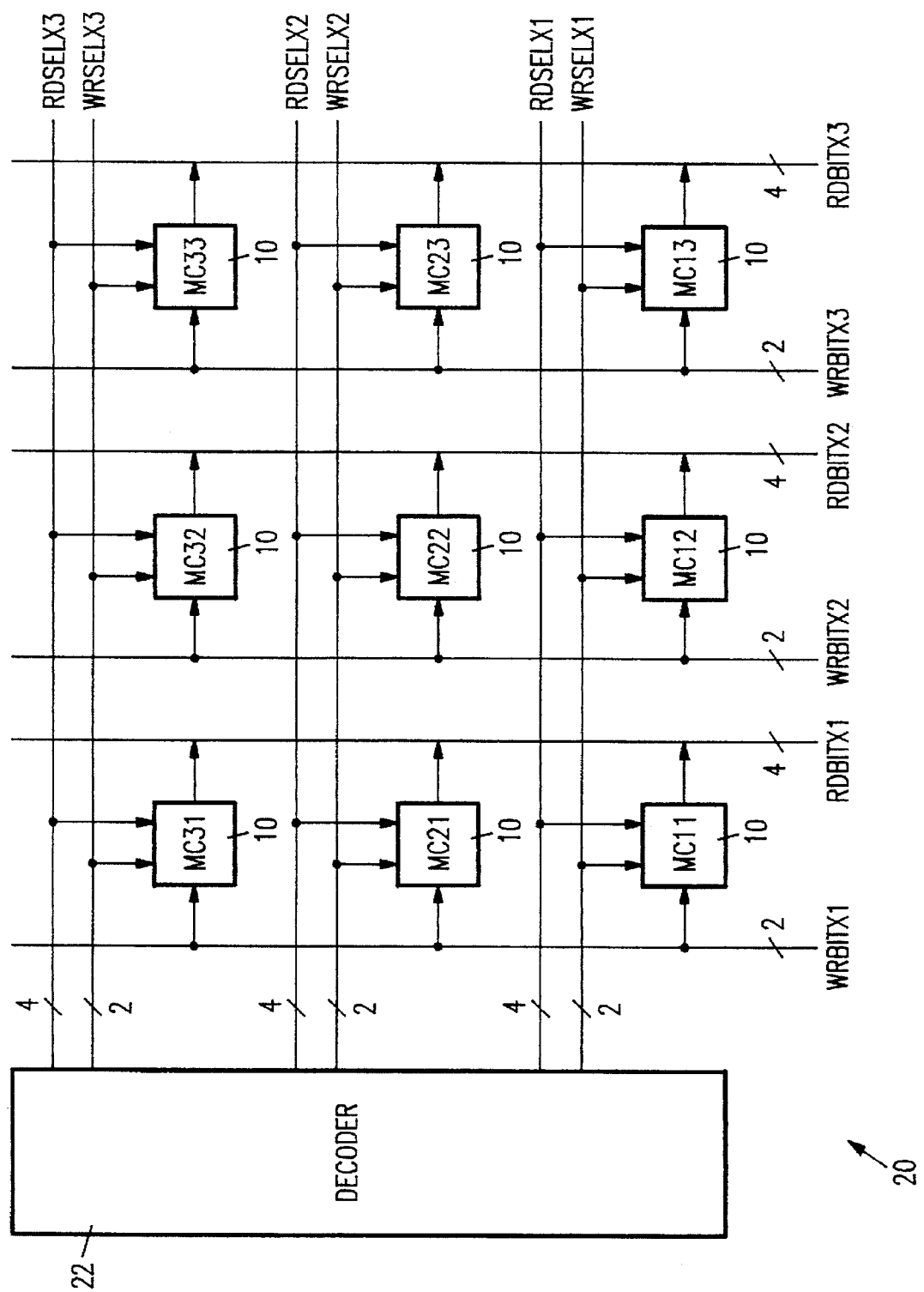
FIG. 2, labelled prior art, is a block diagram of a traditional memory array incorporating a group of memory cells such as the memory cell depicted in FIG. 1.
Figure 5:
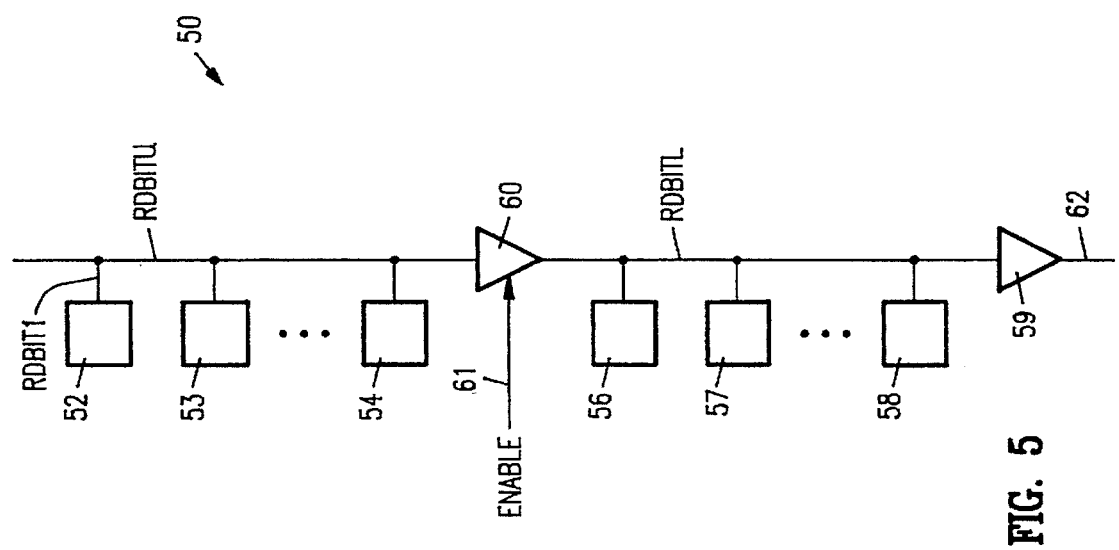
FIG. 5 is a block diagram of a physical embodiment of a read line structure for a single port of a memory array in accordance with the current invention.

Referring now to FIG. 5, a read line structure 50 includes an upper read line RDBITU and a lower read line RDBITL. A read buffer 60 couples the upper read line RDBITU to the lower read line RDBITL when an enable signal conveyed on enable line 61 is active. Memory cells 52, 53, and 54 (representing a portion of the total array) each have a respective read port connected to the upper read line RDBITU, while memory cells 56, 57, and 58 (representing the remaining portion of the total memory array) are likewise coupled to the lower read line RDBITL. A read buffer 59 is also coupled to the lower read line RDBITL for sensing the lower read line RDBITL and for driving a column read output node 62. For clarity, only one read line structure is shown, and all other signals, such as read select lines, write select lines, and write data lines, are not shown.

Figure 6:
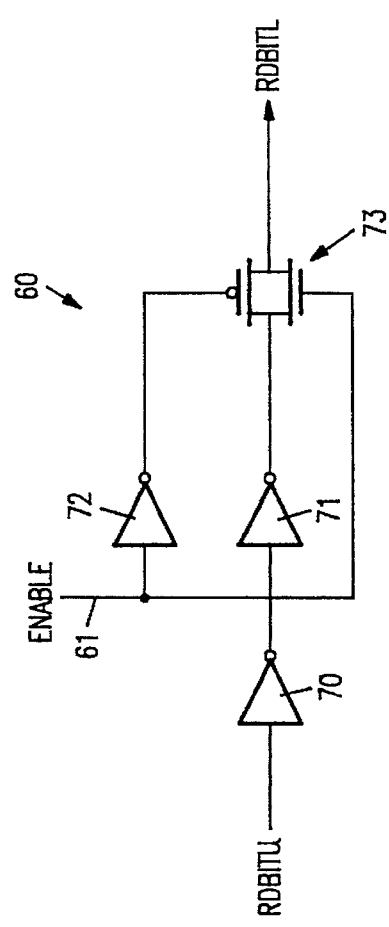
FIG. 6 is a schematic diagram of a read buffer useful for the read line embodiment shown in FIG. 5.

One embodiment of read buffer 60 is illustrated in FIG. 6. The voltage on the upper read line RDBITU is sensed and amplified by inverter 70 and further by inverter 71. The enable signal conveyed on line 61 is inverted by inverter 72, and which two complementary signals together enable a CMOS transmission gate 73. When so enabled, transmission gate 73 provides a path for inverter 71 to drive the lower read line RDBITL. When disabled, transmission gate 73 provides a high impedance output as seen by the lower read line RDBITL, and thus the read buffer 60 will not significantly affect the voltage on the lower read line RDBITL.

Figure 7:
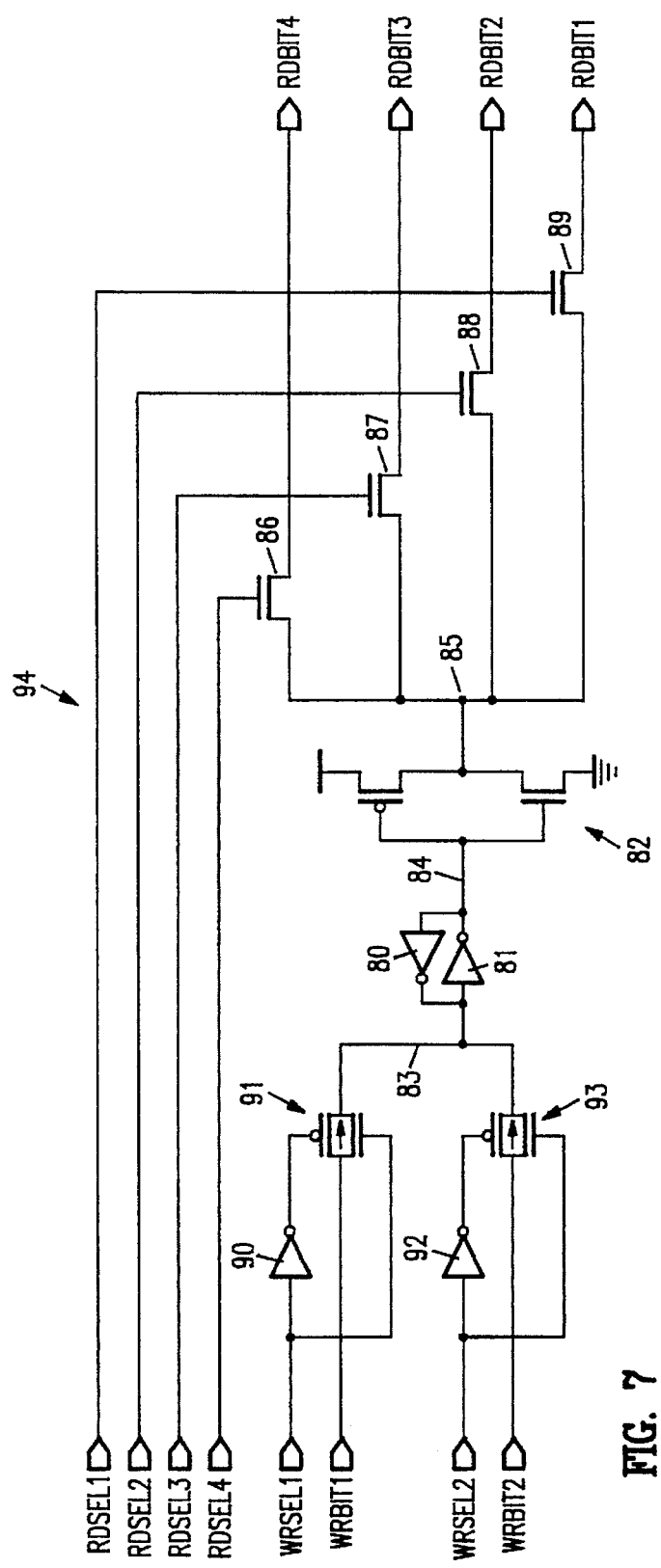
FIG. 7 is a schematic diagram of a multi-port memory cell useful for the read line structure shown in FIG. 5.

FIG. 7 shows a schematic diagram of a multi-port memory cell 94 useful for the read line structure of FIG. 5, and used for memory cells 52, 53, 54, 56, 57, and 58. A pair of cross-coupled inverters 80 and 81 between nodes 83 and 84 provide the basic memory element of the memory cell 94. An inverter 82 buffers the logic level stored on node 84 onto an output node 85, which is then coupled to one or more read lines RDBIT1, RDBIT2, RDBIT3, and RDBIT4 by a respective read select line RDSEL1, RDSEL2, RDSEL3, and RDSEL4 through a respective read access transistor 89, 88, 87, and 86. A first write select line WRSEL1, together with a complement signal generated by inverter 90, enables a transmission gate 91 which conveys a logic level present on a first write data line WRBIT1 into the memory cell. Such a new logic level is written into the memory cell 94 by driving a voltage onto node 83 and overpowering the output of inverter 80, which is designed to be a weak inverter, until inverter 81 drives a complement level onto node 84, and which data is then latched by inverter 80. A second write select line WRSEL2, together with a complement signal generated by inverter 92, enables a transmission gate 93 which conveys a logic level present on a second write data line WRBIT2 into the memory cell. While memory cell 94 shows two write ports and four read ports, one skilled in the art will recognize that such a memory cell is clearly extendable to greater numbers of either write or read ports.

Referring again to FIG. 5, memory cell 52 represents an instantiation of the memory cell 94 depicted in FIG. 7. FIG. 5 shows a connection to only one of the read lines of the memory cell 94. For example, read line RDBIT1 of FIG. 7 is shown connected to the upper read line RDBITU in FIG. 5. For clarity, none of the other remaining read lines RDBIT2–4 within memory cell 94 are shown in FIG. 5, nor are any of the read select lines RDSEL1–RDSEL4, nor any of the write select lines WRSEL1–WRSEL2 and write data lines WRBIT1–WRBIT2.

The operation of the read line shown in FIG. 5 may be described by analysis of several examples. In general, both the upper and lower read line segments are precharged high between memory cell accesses. For example, the upper read line RDBITU may have an associated precharge load (not shown), while the read buffer 60 drives the lower read line RDBITL to a similar precharged state. Other configurations are equally plausible, such as a separate precharge load on the lower read line RDBITL. To read a memory cell coupled to the lower read line RDBITL, such as memory cell 58, the read buffer 60 is disabled. Such an ENABLE signal to read buffer 60 is advantageously a function of upper-order row address bits and a memory array timing signal. When the corresponding read select line (not shown) for this read port is then enabled, the memory cell 58 either discharges the lower read line RDBITL to read a logic "0" or alternatively, leaves the lower read line RDBITL precharged to read a logic "1" (thus leaving the lower read line RDBITL "floating high"). This polarity is advantageously chosen when using a single N-channel read access transistor because such a memory cell, although able to discharge a read line completely to ground potential, is limited by the N-channel threshold voltage in the high voltage the memory cell is able to drive.

Because only a portion of the memory cells corresponding to this read line are actually coupled to the lower read line RDBITL, the capacitance of the lower read line RDBITL is lower than if a single read line were used. Consequently, memory cell 58 is able to discharge the lower read line RDBITL more quickly than otherwise achievable. Because the upper read line remains precharged, less read line power is consumed when reading a memory cell coupled to the lower read line RDBITL. (This is due to the dynamic power necessary to discharge and re-charge a capacitive load.) Further, because the lower read line discharges faster (changes state from high to low more quickly), the read buffer 59 used to sense the lower read line RDBITL has its N-channel and P-channel transistors simultaneously conductive for a shorter period of time, thus further reducing power consumption. Read buffer 59 may include a single invertor, or may include additional buffering or I/O selection logic, as would be readily chosen by one skilled in the art.

Figure 8:
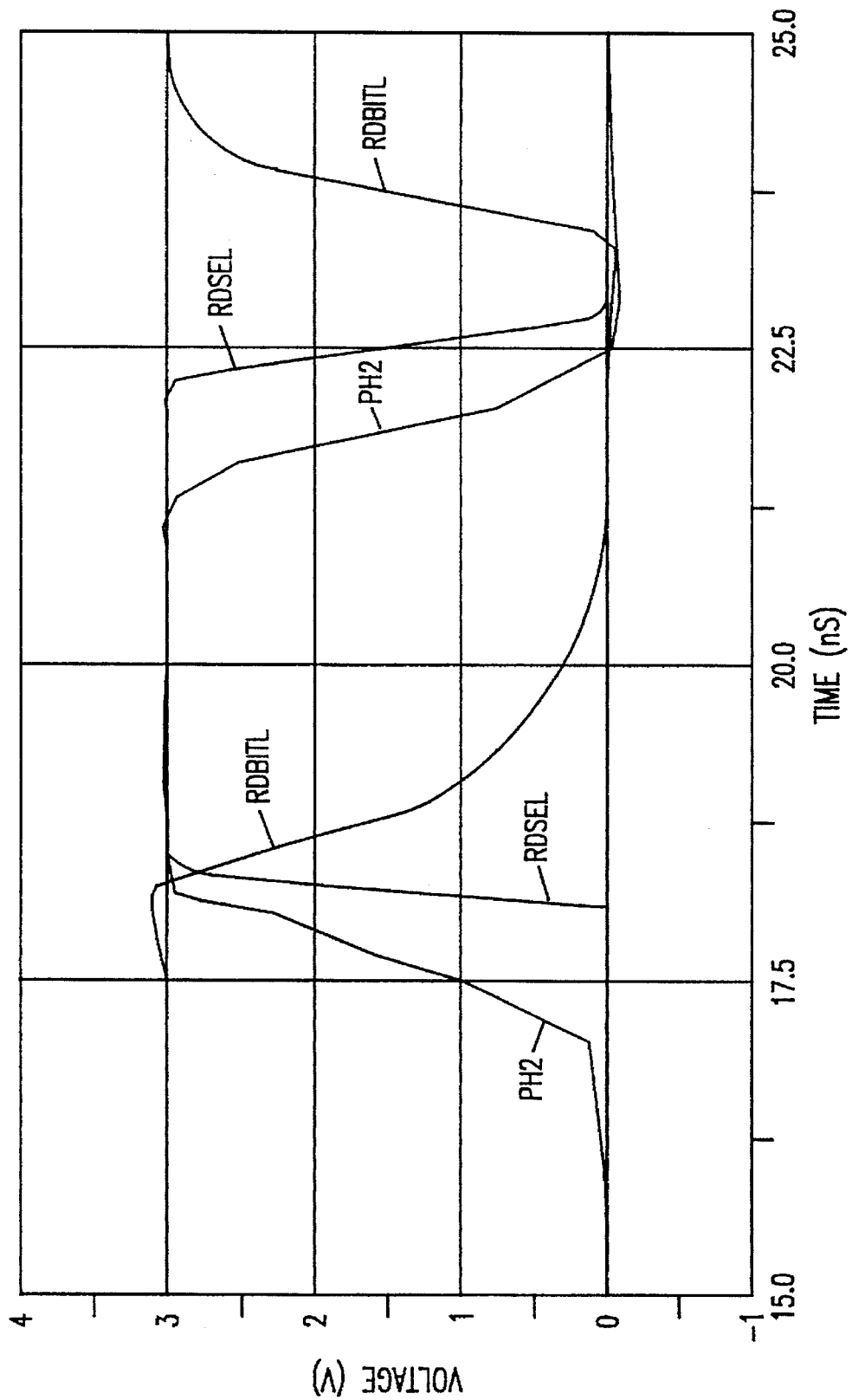
FIG. 8 is a waveform diagram showing certain details of the operation of the read line structure shown in FIG. 5.

FIG. 8 illustrates several waveforms relevant to the above described case. Waveform PH2 is a system clock present in one microprocessor embodiment of the current invention, and does not directly impact this discussion. Waveform RDSEL represents the voltage on a read select line (not shown in FIG. 5) used to address the memory cell being read, such as memory cell 58. In this example, memory cell 58 contains a logic "0" which causes memory cell 58 to discharge the lower read line RDBITL, which is shown as waveform RDBITL. As discussed above, the ENABLE input to read buffer 60 must be inactive before the RDSEL signal for the selected memory cell is driven high.

To read a memory cell coupled to the upper read line RDBITU, such as memory cell 52, both the upper and lower read lines are precharged high between memory cell accesses, as before. When the corresponding read select line (not shown) for this read port is enabled, the memory cell 52 either discharges the upper read line RDBITU to read a logic "0" or alternatively, leaves the upper read line RDBITU precharged to read a logic "1" (thus leaving the upper read line RDBITU "floating high"). The read buffer 60 is enabled to transfer the value of the upper read line RDBITU to the lower read line RDBITL, where the value is sensed by read buffer 59 (and ultimately passed to an output buffer section of the memory array). Since no read select lines are active for any memory cell coupled to the lower read line RDBITL, no corruption of data results from using the lower read line to convey the value from the upper read line RDBITU to the read buffer 59. For a memory cell using separate read and write lines, no feedback path exists for writing data from a read line into the memory cell, which further assures no corruption of data within non-selected memory cells.

Because, as with the lower read line, only a portion of the memory cells corresponding to this read line 50 are actually coupled to the upper read line RDBITU, the capacitance of the upper read line RDBITU is lower, and memory cell 52 is able to discharge the upper read line RDBITU more quickly than otherwise achievable. Since there is only one read buffer 60 for the entire read line 50, the transistor size within buffer 60 (inverter 71 on FIG. 6) used to discharge the lower read line RDBITL is much larger than the transistors within a memory cell (transistor 89 and inverter 82 of FIG. 7) which would otherwise discharge a single read line array. As a result, even though reading a memory cell coupled to the upper read line RDBITU requires a read buffer delay, the lower total capacitance on the upper read line provides for a faster discharge rate on the upper read line RDBITU, and the higher drive capability of read buffer 60 results in a faster discharge rate on the lower read line RDBITL, thus recovering the speed apparently lost. As in the earlier example, the lower read line RDBITL discharges faster and the read buffer 59 used to sense the lower read line RDBITL has its N-channel and P-channel transistors simultaneously conductive for a shorter period of time, thus further reducing power consumption.

Figure 9:
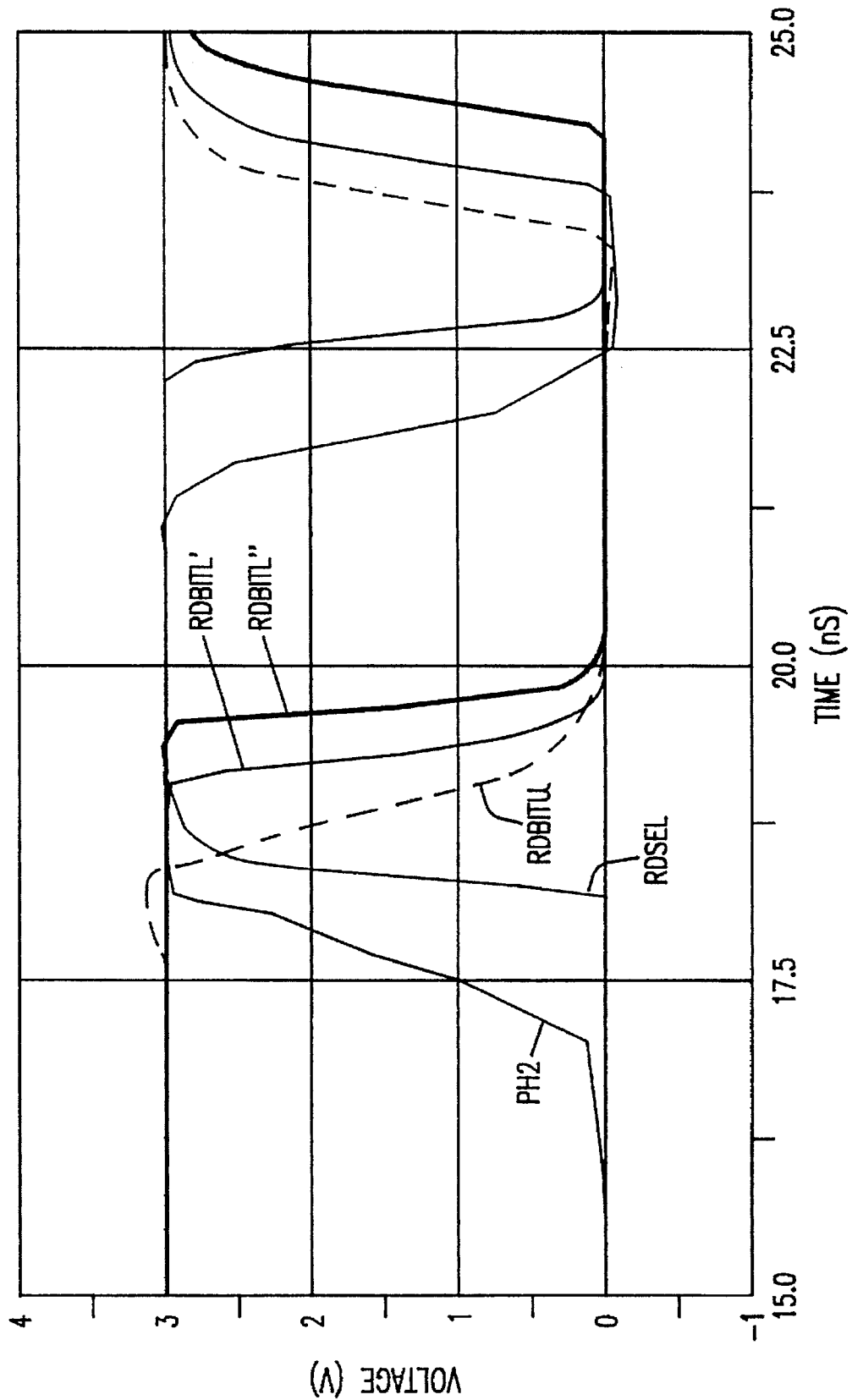
FIG. 9 is a waveform diagram showing additional details of the operation of the read line structure shown in FIG. 5.

FIG. 9 illustrates several waveforms relevant to the above described case. Waveform PH2 is a system clock present in one microprocessor embodiment of the current invention, and is not relevant to this discussion. Waveform RDSEL represents the voltage on a read select line (not shown in FIG. 5) used to address the memory cell 52 being read. In this example, memory cell 52 also contains a logic "0" which causes memory cell 52 to discharge the upper read line RDBITU, which is shown as waveform RDBITU. The read buffer 60, which is enabled, responds to the falling voltage on the upper read line RDBITU by discharging the lower read line RDBITL. The voltage of the end of the lower read line RDBITL nearest read buffer 60 is represented by waveform RDBITL', while the voltage of the opposite end of the lower read line RDBITL (the end nearest read buffer 59) is represented by waveform RDBITL". The voltage difference between waveforms RDBITL' and RDBITL" is caused by the RC delays inherent in driving a relatively long, heavily-loaded line traversing through a memory array of an integrated circuit.

As can be seen by comparing the waveforms in FIG. 8 with those in FIG. 9, it is actually faster to read a memory cell (e.g., memory cell 52) coupled to the upper read line RDBITU than to read a memory cell (e.g., memory cell 58) coupled to the lower read line RDBITL. Such performance results from various design choices, including the number of memory cells coupled to the upper read line RDBITU compared to the number of memory cells coupled to the lower read line RDBITL, and the size of the various "discharging" transistors, as discussed already above.

A significant advantage of this segmented read line structure is the faster read capability discussed above. An additional advantage is a reduction in power dissipation. For example, when used in a register file for a microprocessor, commonly-referenced registers may be grouped together and may be implemented using memory cells coupled to the lower read line RDBITL. Thus, the upper read lines throughout the memory array are quiescent for the frequent accesses to the commonly-referenced registers, and only need be discharged to read a less-frequently-referenced register. The read line segments need not be equal in size, but may be optimized to be greatly dissimilar in the number of memory cells connected to the various readline segments. For example, the lower read line RDBITL may be connected to 64 memory cells, and the upper read line RDBITU may be connected to 128 memory cells, for optimizing a 192-register file having 64 registers more frequently accessed than the remaining 128 registers.

Figure 10:
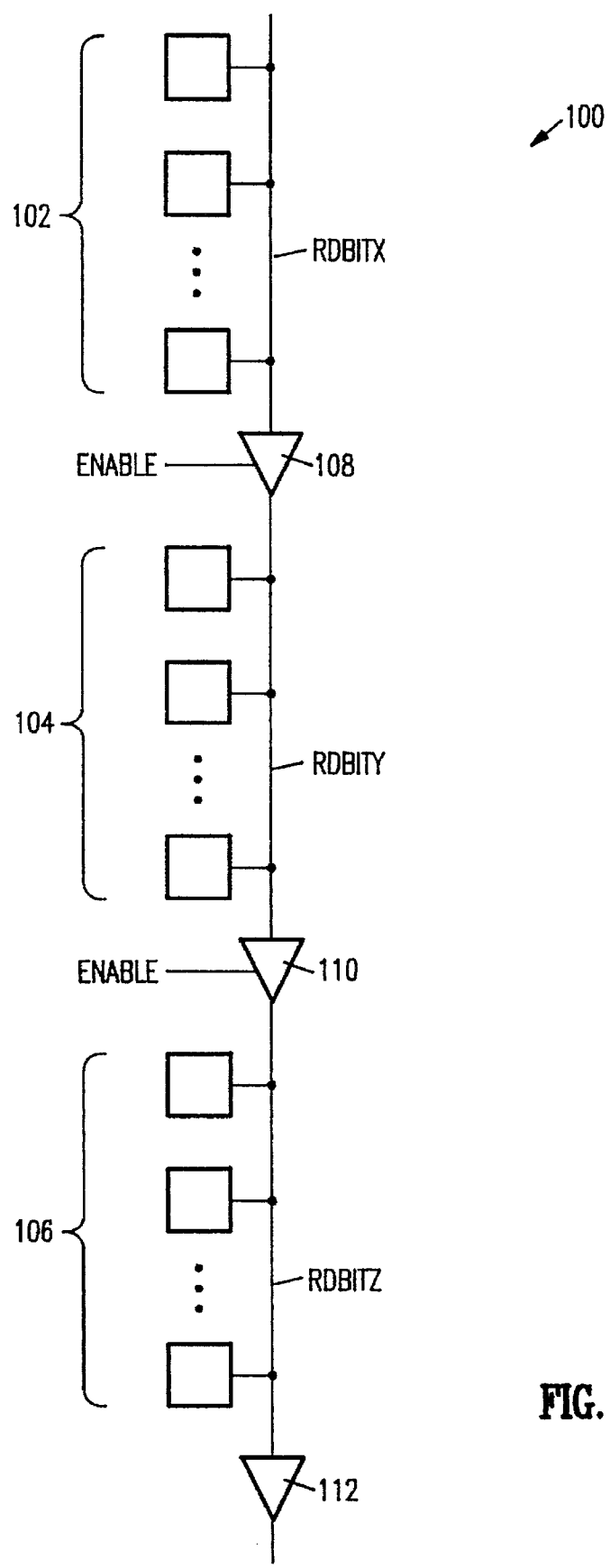
FIG. 10 is a block diagram of another physical embodiment of a read line structure for a single port of a memory array in accordance with the current invention.

One skilled in the art will recognize that the advantages thus-far described are not restricted to read lines having just two segments. Other embodiments having a greater number of segments may also be employed to advantage. For example, FIG. 10 illustrates a read line structure 100 having three read line segments RDBITX, RDBITY, and RDBITZ, each connected to an associated group of memory cells 102, 104, and 106, respectively. In this embodiment, all three read buffers 108, 110, and 112 are enabled to read a memory cell within group 102, and only read buffers 110 and 112 are enabled to read a memory cell within group 104.

An additional advantage of the read line structure of this invention involves the physical layout of an array. Each read line segment of a single read line structure may be routed in the same wiring channel because nowhere do two adjacent read line segments run side-by-side. If an identical memory cell layout is used, the read line segments may actually be in-line with each other, although such a collinear arrangement is certainly not required.

The read buffers herein described may be made relatively small compared to the length of each read line segment, and thus do not significantly increase the size of a memory array.

While the invention has been largely described with respect to the embodiments set forth above, the invention is not necessarily limited to these embodiments. For example, the various read line segments need not be identical in size nor in the number of memory cells connected thereto. As an additional example, the various read line segments can be hierarchically combined with other structures such as a tree structure or an array of memory arrays. Moreover, while the embodiments have been described in the context of a multi-port SRAM array, it should be appreciated that such an array is useful for a variety of circuit blocks, such as cache memories, register files, buffers, and others, and is useful for memory structures such as Dynamic Random Access Memories (DRAMs) and Read-Only Memories (ROMs), and is not merely useful for circuit blocks known commercially as "multi-port static RAMs". Accordingly, other embodiments, variations, and improvements not described herein are not necessarily excluded from the scope of the invention, which is defined by the following appended claims.

What is claimed is:

1. An apparatus for reading a selected memory cell from a column of memory cells within a memory array of an integrated circuit, and for conveying information read therefrom to a column read output node, comprising:

a first read line segment having coupled thereto a first plurality of memory cells;

a second read line segment having coupled thereto a second plurality of memory cells;

a first read buffer having an input coupled to the first read line segment and having an output coupled to the second read line segment, said read buffer having an enable input which, when active, enables the output and which, when inactive, disables the output by causing the output to adopt a high impedance state; and a second read buffer having an input coupled to the second read line segment and having an output coupled to the column read output node.

2. An apparatus as in claim 1 wherein the first read buffer is enabled when the selected memory cell is among the first plurality of memory cells, and wherein the first read buffer is disabled when the selected memory cell is among the second plurality of memory cells.

3. An apparatus as in claim 1 wherein the enable input to the first read buffer is a signal derived from upper-order row address information corresponding to the selected memory cell.

4. An apparatus as in claim 1 wherein the first and second read line segments occupy a single wiring channel within the memory array.

5. An apparatus as in claim 4 wherein the memory array is a multiple read port memory array.

6. An apparatus as in claim 4 wherein the memory array is a single read port memory array.

7. An apparatus as in claim 5 wherein the second plurality of memory cells have a higher frequency of reference than the first plurality of memory cells.

8. An apparatus as in claim 5 wherein the second plurality of memory cells have a frequency of reference which is less than or equal to that of the first plurality of memory cells.

9. An apparatus for reading a selected memory cell from a column of memory cells within a memory array of an integrated circuit, and for conveying information read therefrom to a column read output node, comprising:

a first read line segment having coupled thereto a first plurality of memory cells;

a second read line segment having coupled thereto a second plurality of memory cells;

a first read buffer having an input coupled to the first read line segment and having an output coupled to the second read line segment, said first read buffer for sensing a voltage level of the first read line segment when the selected memory cell is among the first plurality of memory cells, and for subsequently driving a voltage onto the second read line segment corresponding to the voltage level sensed on the first read line segment, and altenatively said first read buffer for adopting a high impedance state on the output thereof when the selected memory cell is among the second plurality of memory cells coupled to the second read line segment; and a second read buffer having an input coupled to the second read line segment and having an output coupled to a column read output node, said second read buffer for sensing a voltage level of the second read line segment when the selected memory cell is among the second plurality of memory cells, and for subsequently driving a voltage onto the column read output node corresponding to the voltage level sensed on the second read line segment, and alternatively when the selected memory cell is among the first plurality of memory cells coupled to the first read line segment, said second read buffer for sensing a voltage level of the second read line segment as driven by the first read buffer, and for subsequently driving a voltage onto the column read output node corresponding to the voltage level sensed upon the second read line segment.

10. An apparatus as in claim 9 wherein the first and second read line segments occupy a single wiring channel within the memory array.

11. An apparatus as in claim 10 wherein the memory array is a multiple read-port memory array.

12. An apparatus as in claim 11 wherein the memory array is configured as a register file of a processor.

13. An apparatus as in claim 12 wherein registers corresponding to the second plurality of memory cells have a higher frequency of reference than registers corresponding to the first plurality of memory cells.

14. An apparatus for reading a selected memory cell from a column of memory cells within a memory array of an integrated circuit, comprising:

a plurality "M" of read line segments arranged sequentially and in a non-overlapping manner, wherein "i"=1, 2, ... "M", each read line segment "i" of the plurality "M" of read line segments having coupled thereto an associated plurality of memory cells;

a plurality "M−1" of read buffers, wherein "j"=1, 2, ... "M−1", each read buffer "j" of the plurality "M−1" of read buffers having an input coupled to a respective read line segment "j" for sensing a voltage level thereon, and each read buffer "j" further having an output coupled to an adjacent read line segment "j+1" for driving, when enabled, a voltage thereon corresponding to the voltage level sensed on its respective input;

a read buffer "M" having an input coupled to a respective read line segment "M" for sensing a voltage level thereon, and having an output coupled to a column read output node for driving a voltage thereon corresponding to the voltage level sensed on its respective input; and wherein a logic state stored within a selected memory cell associated with a read line segment "k" of the column of memory cells, wherein "k"=1, 2, ... "M", is sensed and conveyed to the column read output node by enabling the read buffers "k" through "M" disposed between the read line segment "k" and the column read output node, if any such read buffer is not already enabled.

15. An apparatus as in claim 14 wherein "M" is equal to the integer 2.

16. An apparatus as in claim 14 wherein "M" is equal to the integer 3.

17. An apparatus as in claim 14 wherein "M" is an integer greater than 3.

18. Within a memory array of an integrated circuit, a method for reading a selected memory cell from a column of memory cells and conveying information read therefrom to a column read output node, comprising the steps of:

providing a plurality of read line segments for the column of memory cells, wherein a respective portion of the memory cells within the column are directly connected to a respective one of the plurality of read line segments;

enabling the selected memory cell to drive a signal onto the respective read line segment directly connected thereto, said signal corresponding to a logic value stored previously into the selected memory cell;

sensing the signal developed on the read line segment associated with the selected memory cell;

driving a corresponding signal to the previously-sensed signal onto an adjacent read line segment, said adjacent read line segment disposed between the selected read line segment and the column read output node; and buffering the corresponding signal on the adjacent read line segment to the column read output node by way of any intervening read line segments disposed therebetween.

19. A method as in claim 18 wherein the sensing step is performed using a read buffer having an input coupled to the selected read line segment, and having an output coupled to the adjacent read line segment.

20. A method as in claim 19 wherein the sensing step further comprises enabling the read buffer using a signal derived from upper-order row addresses of the memory array.

* * * * *